United States Patent [19]

Ziolo

[11] Patent Number: 4,876,240

[45] Date of Patent: Oct. 24, 1989

[54] PROCESSES FOR THE PREPARATION OF COPPER OXIDE SUPERCONDUCTORS

[75] Inventor: Ronald F. Ziolo, Webster, N.Y.

[73] Assignee: Xerox Corporation, Stamford, Conn.

[21] Appl. No.: 188,889

[22] Filed: May 2, 1988

[51] Int. Cl.$^4$ .............................................. C01G 3/02
[52] U.S. Cl. ...................................... 505/1; 423/593; 423/604; 423/636; 423/639; 423/337; 423/263; 502/525; 502/355; 501/123; 501/126; 501/152; 501/1; 501/94; 252/521
[58] Field of Search ............... 423/604, 636, 639, 337, 423/263, 593, 593 C, 265; 502/525, 355; 501/123, 126, 152, 1, 94; 252/521; 505/1

[56] References Cited

PUBLICATIONS

Chemical and Engineering New, Jan. 18, 1988, p. 23.
Japanese Journal of Applied Physics, vol. 26, No. 5, May 1987, pp. L858–859.
Materials and Processing Report, "Update Report on High TC Superconductors", vol. 2, No. 4, Jul. 1987, pp. 1–4.
Materials Research Society Symposium Proceedings, vol. 99, High Temperature Superconductors, Kayser et al, "Preparation of High TC YBa$_2$Cu$_3$O$_{7-x}$ Powders from Nitrate and Oxalate Precursors", 1988, pp. 159–164.
Materials Research Society Symposium Proceedings, vol. 99, High Temperature Superconductors, Voigt et al., "A Hydroxycarbonate Route to Super Conductor Precursor Powders", 1988, pp. 635–638.
Japanese Journal of Applied Physics, vol. 26, No. 5, May 1987, pp. L836–L837, Saito et al., "Superconductivity of Sr-La-Cu Oxides Prepared by Coprecipitation Method".
Materials and Processing Report, vol. 2, No. 10, 1988, pp. 1–9.
Proceeding of Symposiums of the 1987 Spring Meeting of Mat. Res. Soc., vol. EA-11, Morris et al., Mobile Oxygen and Isotope Effects in the High Temperature Superconductive YBa$_2$Cu$_3$O$_7$.
Mat. Res. Soc. Symp. Proc., vol. 99, 1988, "Advantages of Barium Peroxide in the Powder Synthesis of Perovskite Superconductors", pp. 615–618, Hepp et al.
Japanese Journal of Applied Physics, vol. 26, No. 55, 1987, pp. L736–737, Kawai et al., "Preparation of High-Tc Y-Ba-Cu-O Superconductor".
Japanese Journal of Applied Physics, vol. 26, No. 5, 1987, pp. L1159–L1160, Fujiki et al., "Preparation of a High-Tc Y-Ba-Cu-O Superconductor using Collodial Method".
Z. Phys. B Condensed Matter, 64, pp. 189–193, 1986, Bednorz et al., "Possible High TC Superconductivity in the Ba-La-Cu-O System".
"Manufacture and Testing of High Tc-Super Conducting Materials", Yarar et al., Advanced Ceramic Materials, vol. 2, No. 3B, 1987, pp. 372–379.
Advanced Ceramic Materials, vol. 2, No. 3B, 1987, Cima et al., "Powder Processing for Microstructural Control in Ceramic Superconductors", pp. 329–336.
Advanced Ceramic Materials, vol. 2, No. 3B, 1987, pp. 656–661, "Thermal Analysis of Ba$_2$YCu$_3$O$_{1-x}$ at 700–1000 C in Air", Cook et al.
Japanese Journal of Applied Physics, vol. 26, No. 5, May 1987, "Single Crystal Preparation of Ba$_2$YCu$_3$O$_x$ from Nonstoichiometric Melts", Takekaw et al., pp. L851–853.
Japanese Journal of Applied Physics, vol. 26, No. 4, Apr. 1987, pp. L498–501, "X-Ray and Electron Microscopic Study of a High Temperature Superconductor, etc., ".
Chemistry of High-Temperature Superconductors, Chapter 7, Davison et al., and Chapter 11, Holland et al., American Chemical Society, 1987, pp. 65–78, and pp. 102–113.
Japanese Journal of Applied Physics, vol. 26, No. 5, May 1987, pp. L858–L859.
Materials and Processing Report, "Update Report on High T$_c$ Superconductors", vol. 2, No. 4, Jul. 1987, pp. 1–4.

Primary Examiner—Robert L. Stoll
Assistant Examiner—Paige C. Harvey
Attorney, Agent, or Firm—E. O. Pagazzo

[57] ABSTRACT

A process for the preparation of copper oxide superconductors which comprises (1) mixing copper nitride, an oxidizing agent such as barium peroxide, and yttrium oxide; (2) forming pellets of the aforementioned mixture; (3) heating the pellets; and (4) thereafter cooling the pellets. The process yields copper oxide superconducting compounds in a purity of from about 60 to over 95 percent.

20 Claims, No Drawings

PROCESSES FOR THE PREPARATION OF COPPER OXIDE SUPERCONDUCTORS

BACKGROUND OF THE INVENTION

This invention is generally directed to processes for the preparation of superconductors, and more specifically the present invention is directed to processes for preparing certain high temperature copper oxide superconductors. Thus, in accordance with the simple, economical process of the present invention there can be prepared superconductors of, for example, the formula $YBa_2Cu_3O_{7-x}$, wherein x is close to zero, by the reaction of copper nitride, an oxidizing component such as barium peroxide, and a component of the formula $Y_2O_3$ wherein y is yttrium. One specific embodiment of the present invention comprises the reaction of $Y_2O_3$, barium peroxide, and copper nitride in the presence of oxygen, which reaction is generally accomplished at high temperatures of from about 900° C. to about 975° C.Z, followed by allowing the mixture to cool. With the process of the present invention, there is provided a superconductor of high purity wherein only a single heating step is needed, and morever the process of the present invention is more economical from, for example, a cost standpoint than prior art processes. Accordingly, with the process of the present invention a simple economical method for the synthesis of copper oxide superconductors in a purity of from about 60 to about 95 percent or greater is provided; for example, only about one half of the energy is utilized and the processing time, especially the heating period, is reduced in comparison to many prior art processes. Also, the superconductors of the present invention have know uses equivalent to those of conventional Type 2 superconductors, including their selection for electrical motors, reference C&EN, Jan. 18, 1988, page 23.

Processes for the preparation of superconductors are known. Thus, for example, it is known that copper oxide superconductors can be prepared by high temperature, above 900° C., ceramic methods. In the aforementioned processes, barium carbonate, $Y_2O_3$, and copper oxide are admixed, and ground with a mortar and pestle; and subsequently, the resulting product is pressed into pellets. Thereafter, the products are fired in an oven at about 950° C. for about 10 hours. The pellet product after cooling are ground, and pressed a second time, and thereafter sintered at 950° C. for in excess of 10 hours. The resulting material evidences a variety of superconducting properties such as zero dc resistance and the Meissner effect. Often the material is multiphased with undesirable nonsuperconducting phases diluting the superconductor phase. Thus, the copper oxide superconductor resulting of the formula illustrated herein may contain therein impurities such as nonsuperconducting phases, reference for example the *Japanese Journal Of Applied Physics*, Volume 26, No. 5, May of 1987. For example, one specific contaminant present in the aforementioned superconductors is believed to be the green compound $Y_2BaCuO_5$, which in of itself does not function as a superconductor. Generally, this contaminant results from the reactants selected, or utilizing the incorrect stoichiometric reactant amounts in the initial reaction mixture.

Accordingly, while processes for the preparation of superconductors are known, there is a need for simple, economical processes that will enable copper oxide superconductors of a high purity. More specifically, there is a need for processes that will enable the formulation of copper oxide superconductors of a purity of 80 percent or greater. There is also a need for efficient processes for the preparation of copper oxide superconductors wherein the complex regrinding, and further pressing of pellets can be avoided. Also, there is a need for processes wherein high purity superconductors can be obtained with one heating step, and the product resulting has improved homogeneity and packing density. Furthermore, there is a need for processes for formulating superconductors wherein the pregrinding of copper oxide reactant is avoided, and wherein less energy is utilized.

SUMMARY OF THE INVENTION

It is therefore an object of the present invention to provide processes for the preparation of superconductors of high purity.

A further object of the present invention is the provision of an economical process for the preparation of copper oxide superconductors.

Additionally, in a further object of the present invention there are provided simple, economical, efficient processes for the preparation of high purity copper oxide superconductors.

Another object of the present invention resides in the preparation of copper oxide superconductors of a purity exceeding 95 percent.

In yet another specific object of the present invention there are provided processes for the preparation of high purity copper oxide superconductors of the formula $YBa_2Cu_3O_{7-x}$, which superconductors are substantially free of impurities.

Furthermore, In yet another specific object of the present invention there are provided processes for the preparation of the aforementioned copper oxide superconductors wherein a second heating step is avoided, and pregrinding of a copper oxide reactant is not necessary.

Also, there are provided in another object of the present invention efficient, simple processes for the preparation of copper oxide superconductors wherein less energy is consumed since, for example, the heating time is reduced.

These and other objects of the present invention are accomplished by the provision of a process for the preparation of copper oxide superconductors in high purity. More specifically, the process of the present invention comprises the reaction in the presence of oxygen of copper nitride, an oxidizing agent, preferably barium peroxide, and yttrium oxide at a suitable temperature needed to permit formation of the final product such as about 950° C. In one specific embodiment of the present invention, there is provided a process for the preparation of superconductors, which comprises mixing copper nitride, an oxidizing agent, and yttrium oxide; thereafter forming pellets of the mixture by known means; subsequently heating the mixture to a temperature of from about 940° C. to about 950° C. for from about 4 to about 15 hours; followed by cooling in air pure oxygen, mixtures of pure oxygen with helium, which mixtures contain, for example, from about 22 to about 99 percent by weight of oxygen, and the like.

With further regard to the process of the present invention, the reactants can be mixed for various time periods providing the objectives of the present invention are achievable, however, usually mixing is accomplished for between from about 5 to about 10 minutes with preferably a mortar and pestle. In this manner, grinding of the reactants is accomplished. Subsequent to the aforementioned grinding and pressing, there are obtained particles with an average diameter size of from about 5 millimicrons or less to about 10 millimicrons or less. Additionally, heating can be accomplished by a number of known methods including heating in a Lindberg tube furnace with an automatic controller or a Marshall II furnace with a Eurotherm controller. Subsequently, the pellets formed can be cooled at a rate, for example, of 2° C. per minute to room temperature generally from about 20° to 25° C. by disconnecting the oven, and removing the pellets therefrom. The high purity, up to 100 percent in some instances, superconducting product $YBa_2Cu_3O_{7-x}$ obtained, can be identified by various methods including X-ray diffraction analysis and by d.c. resistance versus temperature measurements.

The invention will now be described in detail with reference to specific preferred embodiments thereof, it being understood that these examples are intended to be illustrative only. The invention is not intended to be limited to the materials, conditions, or process parameters recited herein.

EXAMPLE I

Stoichiometric amounts of yttrium oxide, barium peroxide and copper nitride were weighed and mixed. Specifically, 0.861 gram of $Y_2O_3$, 2.580 grams of $BaO_2$, and 1.559 grams of $Cu_3N$ were mixed together and ground in an aluminum oxide mortar and pestle for a period of 3 minutes. Thereafter, the powder resulting was pressed into 1 gram, 13 millimeter diameter pellets at 20,000 lbs./in.$^2$ with a Carver press. The pellets resulting were then placed in a high-grade alumina combustion boat lined with 2 mil thick platinum foil. Subsequently, the boat was placed in a tube furnace and heated to 940° C. for 10 hours under flowing oxygen. Thereafter, the pellets were then removed from the furnace and under flowing oxygen cooled to room temperature at the rate of 2° C. per minute. There resulted a superconductor of the formula $YBa_2Cu_3O_{7-x}$, which had a purity of greater than 95 percent as determined by X-ray analysis.

EXAMPLE II

The procedure in Example I was repeated for a mixture containing 0.226 gram of $Y_2O_3$, 0.677 gram of $BaO_2$, and 0.409 gram of $Cu_3N$ with the exception that 0.5 gram of rectangular pellets having a 3 x 15 millimeter size were pressed at a pressure of 8,000 lbs./in.$^2$ and were heat treated for 12 hours at 925° C. under oxygen. The pellets were cooled under flowing oxygen to room temperature at the rate of 2° C. per minute. Substantially similar results were obtained.

EXAMPLE III

A superconductor prepared by the processes described in the prior art is detailed in Examples III to V, wherein in Example III a 1:3 mole ratio mixture of copper nitride, and copper oxide were selected; in Example IV a 1:1 mole ratio mixture of copper nitride, and copper oxide were selected; and in Example V a 3:1 mole ratio mixture of copper nitride, and copper oxide were selected.

The procedure of Example I was repeated for a mixture containing 0.861 gram of $Y_2O_3$, 2.580 gram of $BaO_2$, 0.390 gram of $Cu_3N$, and 1.365 gram of CuO. Thus, 25 percent of the copper in the final product $YBa_2Cu_3O_{7-x}$ was derived from $Cu_3N$, while the CuO provides the remaining 75 percent. The resulting pellets exhibited a very weak Meissner effect relative to the samples obtained from Examples I and II. In addition, the pellets evidenced a large amount, about 20 percent, of the bright green undesirable contaminant phase, $Y_2BaCuO_5$, as determined by X-ray for example, which is not a superconductor, and is insulating.

The identity of the green phase was confirmed by X-ray diffraction. When the procedure is repeated using CuO as the only source of copper, that is 1.820 gram of CuO and zero grams $Cu_3N$, an even larger amount (about 25 percent) of $Y_2BaCuO_5$ forms. It was this phase that contained the polycrystalline sample in which superconductivity at temperatures in excess of 90° K. was first observed.

EXAMPLE IV

1:1 Mole Ratio Mixture of $Cu_3N$ and CuO

The procedure of Example III was repeated with a 1:1 mole ratio of $Cu_3N$ to CuO. Thus, 0.861 gram of $Y_2O_3$, 2.580 grams of $BaO_2$, 0.780 gram of $Cu_3N$, and 0.910 gram of CuO were mixed, ground and treated as described in Example III. The resulting superconducting pellets were compared to those from Example III and evidenced a small amount of the $Y_2BaCuO_5$ green phase by visual inspection. Although the pellets exhibited a stronger Meissner effect than the pellets of Example III, the effect was much weaker than that exhibited by the pellets of Example I where all of the copper was derived from $Cu_3N$.

EXAMPLE V

3:1 Mole ratio Mixture of $Cu_3N$ and CuO

The procedure of Example III was repeated for a mixture of yttrium oxide, barium peroxide, and copper derived from a 3:1 mole ratio mixture of copper nitride and cupric oxide. Thus, 0.861 gram of $Y_2O_3$, 2.580 grams of $BaO_2$, 1.170 grams of $Cu_3N$, and 0.455 gram of CuO were mixed and processed as in Example I. The resulting pellets evidenced no green phase by visual observation although minute specks of the green phase could be seen at 100× magnification, and were very sparsely distributed. The sample was superconducting at 90° K. as shown by d.c. resistance measurements, and exhibited a Meissner effect nearly equal to that of the superconducting pellets produced using 100 percent $Cu_3N$ as the copper source. X-ray powder diffraction patterns showed no green phase indicating less than approximately 5 percent $Y_2BaCuO_5$.

When the procedures of Examples II, IV, and V were repeated with preground, average diameter about 5 microns, of CuO, no significant change was noted in the resulting pellets. The contaminating green phase was still present, and the Meissner effect was less than that observed for pellets obtained from $Cu_3N$ as the only source of copper.

Thus, an important advantage with the process of the present invention, especially with regard to the selection of $Cu_3N$ and $BaO_2$, is that their reaction (decomposition) at low temperature insures a much greater degree of homogeneity in the final product than does the reaction involving CuO and $BaCO_3$, which do not undergo decomposition below 1000° C. In the former process, the chemical breakdown of the starting materials insures smaller particle size and better particle-to-particle contact for a more intimate mix. Homogeneity is important in $YBa_2Cu_3O_{7-x}$ superconducting since it improves its superconducting properties.

With further regard to the superconducting materials of the present invention, and particularly those as prepared in accordance with the process as detailed in Examples I and II, X-ray diffraction analysis of the crushed pellets indicated that they were comprised of single-phase $YBa_2Cu_3O_{7-x}$ with the absence of any contaminating phases as the green $Y_2BaCuO_5$ and other phases that might be found after the first firing in the conventional preparation. In addition, the pellets were observed to levitate a centimeter or higher above a 2,000 gauss samarium-cobalt magnet from 77° to 91° K. evidencing a positive demonstration of the Meissner effect. Comparable levitation using pellets prepared by the conventional method, Example III, could only be achieved with pellets that were processed and fired twice. Also, with the process of the present invention, superconducting $YBa_2Cu_3O_{7-x}$ can be obtained in about half the process time using half the energy than that required by the conventional preparation methods.

Further, since a carbonate, such as that of barium, is not used in the process of the present invention, the need to calcine the starting materials, as is done in several prior art processes, is eliminated. This is an important advantage in that during calcining, the carbonates often remain stable and do not always decompose. Furthermore, the need to remill or regrind the calcined materials is also eliminated.

With further respect to the process of the present invention the superconducting properties of the material $YBa_2Cu_3O_{7-x}$ could be improved by slowly cooling it in flowing oxygen at a rate of 1° to 2° C. per minute between 500° and 600° C. for between 1 and 5 hours.

Although the invention has been described with reference to specific preferred embodiments, it is not intended to be limited thereto, rather those skilled in the art will recognize that variations and modifications may be accomplished therein which are within the spirit of the present invention and within the scope of the following claims.

What is claimed is:

1. A process for the preparation of copper oxide superconductors which comprises (1) mixing stochiometric amounts of copper nitride, an oxidizing agent, and yttrium oxide; (2) forming pellets of the aforementioned mixture; (3) heating the pellets; and (4) thereafter cooling said pellets.

2. A process in accordance with claim 1 wherein the oxidizing agent is barium peroxide.

3. A process in accordance with claim 1 wherein the formation of the pellets includes the grinding thereof, followed by pressing at a pressure of from about 1 to about 20,000 pounds per inch squared.

4. A process in accordance with claim 1 wherein heating and cooling are in the presence of oxygen.

5. A process in accordance with claim 1 wherein cooling is in the presence of a mixture of oxygen and helium.

6. A process in accordance with claim 1 wherein heating is at a temperature of from about 900° to about 975° C.

7. A process in accordance with claim 1 wherein heating is for a period of from about 4 to about 15 hours.

8. A process in accordance with claim 1 wherein heating is affected in a furnace.

9. A process in accordance with claim 1 wherein cooling is affected to room temperature.

10. A process in accordance with claim 1 wherein cooling is affected over a period of from about 1 minute to about 10 hours.

11. A process in accordance with claim 1 wherein the purity of the superconductor is from about 90 to about 100 percent.

12. A process in accordance with claim 1 wherein the superconductor is of the formula $YBa_2Cu_3O_{7-x}$ and wherein x is close to zero.

13. A process in accordance with claim 1 wherein heating is for 10 hours at a temperature of from about 940° C. to about 950° C.

14. A process in accordance with claim 1 wherein the pellets are cooled to room temperature at a rate of 2° C. per minute.

15. A process in accordance with claim 1 wherein the pellets are of an average diameter of from about 5 millimicrons to about 10 millimicrons.

16. A process for the preparation of copper oxide superconductors which comprises (1) mixing stochiometric amounts of copper nitride, an oxidizing agent, and yttrium oxide; (2) heating; and (3) thereafter cooling the mixture.

17. A process in accordance with claim 1 wherein the pellets are cooled to a temperature of from about 20° to 25° C.

18. A process in accordance with claim 1 wherein the pellets are cooled to a temperature of from about 20° to 25° C. at a rate of 2° C. per minute.

19. A process for preparing copper oxide superconductors which comprises (1) preparing a mixture consisting essentially of copper nitride, barium peroxide, and yttrium oxide; (2) forming pellets of the aforementioned mixture; (3) heating the pellets; and (4) thereafter cooling the pellets.

20. A process for preparing copper oxide superconductors which consists essentially of (1) preparing a mixture consisting essentially of copper nitride, barium peroxide, and yttrium oxide; (2) forming pellets of the aforementioned mixture; (3) heating the pellets; and (4) thereafter cooling the pellets.

* * * * *